(12) United States Patent
Del Sarto et al.

(10) Patent No.: US 11,309,237 B2
(45) Date of Patent: Apr. 19, 2022

(54) SEMICONDUCTOR PACKAGE WITH WETTABLE SLOT STRUCTURES

(71) Applicants: STMICROELECTRONICS S.r.l., Agrate Brianza (IT); STMICROELECTRONICS (MALTA) LTD, Kirkop (MT)

(72) Inventors: Marco Del Sarto, Monza (IT); Alex Gritti, Vimercate (IT); Pierpaolo Recanatini, Ornago (IT); Michael Borg, Birkirkara (MT)

(73) Assignees: STMICROELECTRONICS S.r.l., Agrate Brianza (IT); STMICROELECTRONICS (MALTA) LTD, Kirkop (MT)

( * ) Notice: Subject to any disclaimer, the term of this patent is extended or adjusted under 35 U.S.C. 154(b) by 307 days.

(21) Appl. No.: 16/586,643

(22) Filed: Sep. 27, 2019

(65) Prior Publication Data

US 2021/0098355 A1 Apr. 1, 2021

(51) Int. Cl.
*H01L 23/498* (2006.01)
*H01L 23/31* (2006.01)

(52) U.S. Cl.
CPC .... *H01L 23/49838* (2013.01); *H01L 23/3121* (2013.01); *H01L 23/3157* (2013.01); *H01L 23/49822* (2013.01)

(58) Field of Classification Search
CPC ......... H01L 23/49838; H01L 23/49861; H01L 23/522; H01L 23/3157; H01L 23/3171; H01L 23/3121; H01L 23/49805; H01L 23/49548; H01L 23/49558; H01L 23/49822; H01L 23/49827; H01L 21/486; H01L 21/4857
See application file for complete search history.

(56) References Cited

U.S. PATENT DOCUMENTS

| | | | |
|---|---|---|---|
| 6,238,952 B1 | 5/2001 | Lin | |
| 6,608,366 B1* | 8/2003 | Fogelson | H01L 23/3107 257/666 |
| 6,888,231 B2 | 5/2005 | Maeda | |
| 6,909,166 B2 | 6/2005 | Frezza et al. | |
| 7,397,112 B2* | 7/2008 | Sato | H01L 23/49548 257/666 |
| 2001/0044169 A1 | 11/2001 | Yasunaga et al. | |
| 2002/0060342 A1* | 5/2002 | Kobayakawa | H01L 23/3121 257/347 |
| 2003/0006055 A1 | 1/2003 | Chien-Hung et al. | |
| 2017/0278762 A1 | 9/2017 | Kessler et al. | |
| 2019/0363039 A1* | 11/2019 | Appelt | H01L 21/4857 |
| 2021/0082795 A1* | 3/2021 | Liao | H01L 23/3121 |

FOREIGN PATENT DOCUMENTS

| | | | | |
|---|---|---|---|---|
| CN | 101160657 A | * | 4/2008 | ............ H01L 24/97 |
| JP | 10-65298 A | | 3/1998 | |
| JP | 2000-294719 A | | 10/2000 | |

* cited by examiner

*Primary Examiner* — Errol V Fernandes
*Assistant Examiner* — Jeremy J Joy
(74) *Attorney, Agent, or Firm* — Seed IP Law Group LLP

(57) ABSTRACT

The present disclosure is directed to a semiconductor package including a substrate having a lower surface with a plurality of slot structures. The plurality of slot structures are multi-layer structures that encourage the formation of solder joints. The semiconductor package is desirable for high reliability applications in which each solder joint termination should be checked by visual systems to ensure a proper electrical connection has been made.

19 Claims, 8 Drawing Sheets

SEMICONDUCTOR PACKAGE WITH WETTABLE SLOT STRUCTURES

BACKGROUND

Technical Field

The present disclosure is directed a semiconductor package for a semiconductor die.

Description of the Related Art

Semiconductor packages typically include a substrate, and a semiconductor die attached to the substrate. The substrate is electrically coupled to the semiconductor die, and includes various connection lines to carry electrical signals between the semiconductor die and, for example, a printed circuit board (PCB). Typically, the substrate is mounted on the PCB by soldering the substrate to the PCB. For example, semiconductor packages often include leads, sometimes referred to as lands, that are exposed on a bottom surface of the semiconductor package, and are electrically coupled to a PCB by soldering the leads to contact pads on the PCB.

Subsequent to being soldered to a PCB, semiconductor packages are often inspected to ensure that proper electrical connections between the semiconductor package and the PCB have been made. For example, for automotive applications, visual systems (e.g., automated optical inspection systems) are often used to visually check solder joint terminations to ensure that proper electrical connections have been made.

Unfortunately, solder joints are not consistently formed and are often undetectable by visual systems. For example, solder joints often do not extend outward from the semiconductor package enough to form solder fillets that are detectable by a visual system. Consequently, many current semiconductor packages that are mounted with solder are not suitable for high reliability applications, such as automobile applications, in which it is important for solder joints to be checked by visual systems for proper electrical connections.

BRIEF SUMMARY

The present disclosure is directed to a semiconductor package including a substrate that facilitates the formation of solder joints. The substrate includes a lower surface with a plurality of slot structures. The slot structures, compared to traditional leads, provide multiple, large wettable surfaces that encourage the formation of solder joints. When the semiconductor package is mounted to a PCB, solder formed in the slot structures consistently extends outward from the semiconductor package due to the increased amount of solder on the large wettable surface. The portions of the solder that extends outward from the semiconductor package are often referred to as solder fillets. As the solder fillets extend outward from the leadless semiconductor package, solder joint terminations may be easily detected by inspection systems, such as automated optical inspection systems. Further, the large solder fillets improve the overall strength and reliability of the physical and electrical connection between the semiconductor package and the PCB. Accordingly, the leadless semiconductor package is suitable for high reliability applications in which each solder joint should be checked to ensure a proper electrical connection has been made.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of manufacturing electronic devices and semiconductor packages have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting or glass substrates, whether or not the components are coupled together into a circuit or able to be interconnected. Throughout the specification, the term "layer" is used in its broadest sense to include a thin film, a cap, or the like, and one layer may be composed of multiple sub-layers.

It is noted that the dimensions set forth herein are provided as examples. Other dimensions are envisioned for this embodiment and all other embodiments of this application.

As discussed above, when a semiconductor package is soldered to an external component, such as a printed circuit board (PCB), solder joints are not consistently formed and are often not detectable by visual systems. Consequently, many current semiconductor packages that are mounted with solder are not suitable for high reliability applications in which solder joints should be verified for proper electrical connections.

Figure 1:
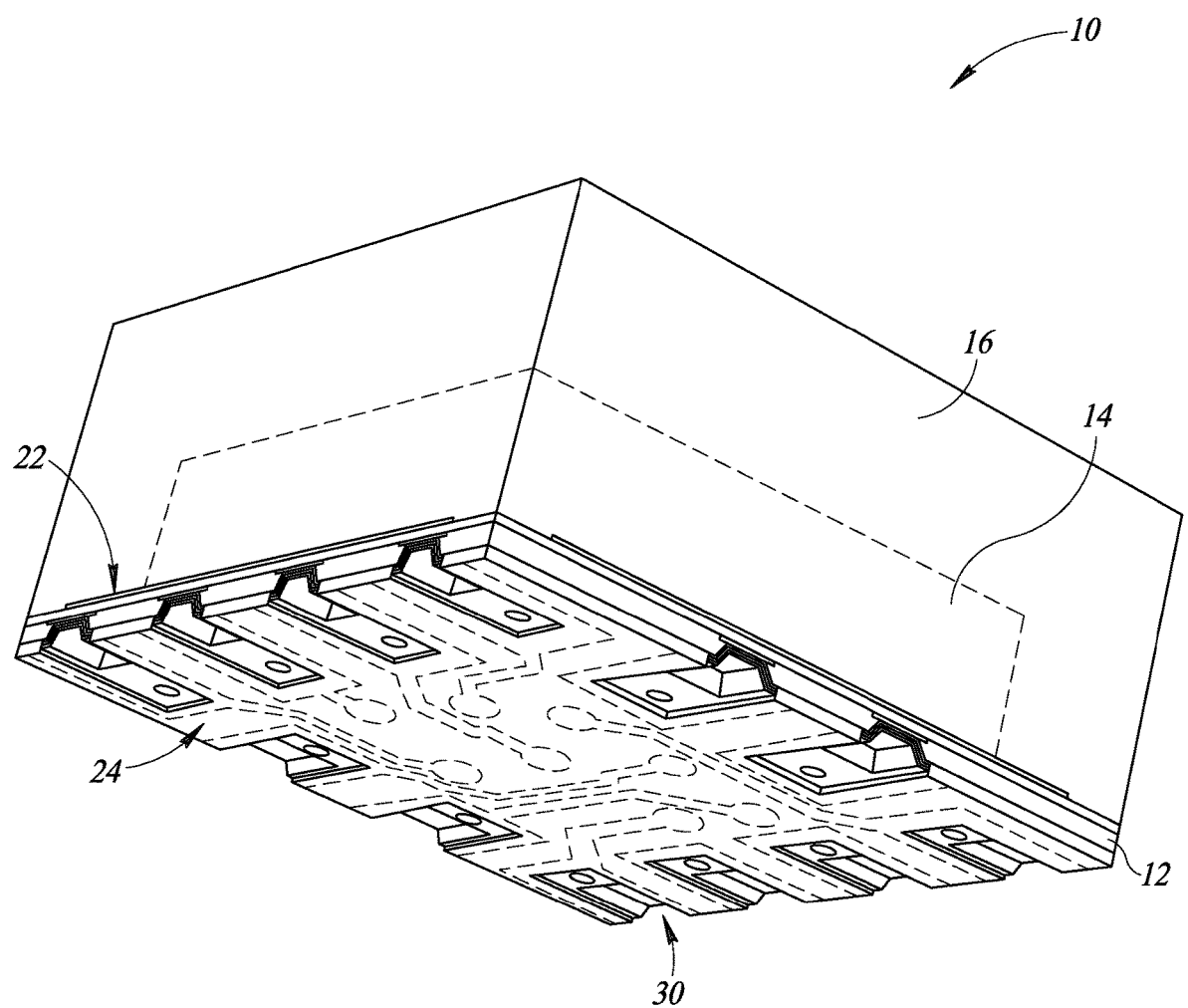
FIG. 1 is an angled view of a semiconductor package according to one embodiment disclosed herein.

The present disclosure is directed to a semiconductor package including a substrate that facilitates the formation of solder joints. FIG. 1 is an angled view of a semiconductor package 10 according to one embodiment disclosed herein. The semiconductor package 10 includes a substrate 12, a semiconductor die 14, and encapsulation material 16.

The substrate 12 provides a platform for the semiconductor die 14, and includes various electrical connections and slot structures for carrying electrical signals between the semiconductor die 14 and, for example, a PCB when the semiconductor package 10 is mounted on the PCB.

The substrate 12 has a first side 22 and a second side 24 opposite to the first side 22. As will be discussed in further detail with respect to FIGS. 2 and 3, the substrate 12 includes various conductive, support, and protective layers; a plurality of contact pads 26 on the first side 22; a plurality of slot structures 30 on the second side 24; and a plurality of electrical connections 28 on both the first side 22 and the second side 24. In one embodiment, the substrate 12 has a thickness 25 that is between 125 and 175 micrometers.

The semiconductor die 14 includes one or more integrated circuits. The semiconductor die 14 may be any type of semiconductor die. For example, the semiconductor die 14 may be a processor, a sensor, a microelectromechanical system, or any other type of electronic chip that includes active (e.g., transistors) and passive circuitry (e.g., resistors, capacitors, inductors, etc.).

The semiconductor die 14 is positioned on the first side 22 of the substrate 12. In one embodiment, the semiconductor die 14 is attached to the substrate 12 by adhesive material. The semiconductor die 14 is electrically coupled to the plurality of slot structures 30 via the plurality of contact pads 26, the plurality of electrical connections 28, and the plurality of slot structures 30. The plurality of contact pads 26, the plurality of electrical connections 28, and the plurality of slot structures 30 will be discussed in further detail below.

The encapsulation material 16 protects the semiconductor die 14 from external sources of damage, such as physical damage, moisture, corrosion, or any other types of causes of damage. In one embodiment, the encapsulation material 16 is a molding compound that includes one or more of polyurethane, epoxy, acrylic, polymer, silicone, epoxy resin, or any other suitable material.

The encapsulation material 16 is formed on the substrate 12 and the semiconductor die 14. In particular, the encapsulation material 16 is formed over the semiconductor die 14 on the first side 22 of the substrate 12. In one embodiment, as shown in FIG. 1, the encapsulation material 16 completely covers the semiconductor die 14 such that the semiconductor die 14 is not exposed to a surrounding environment.

Figure 2:
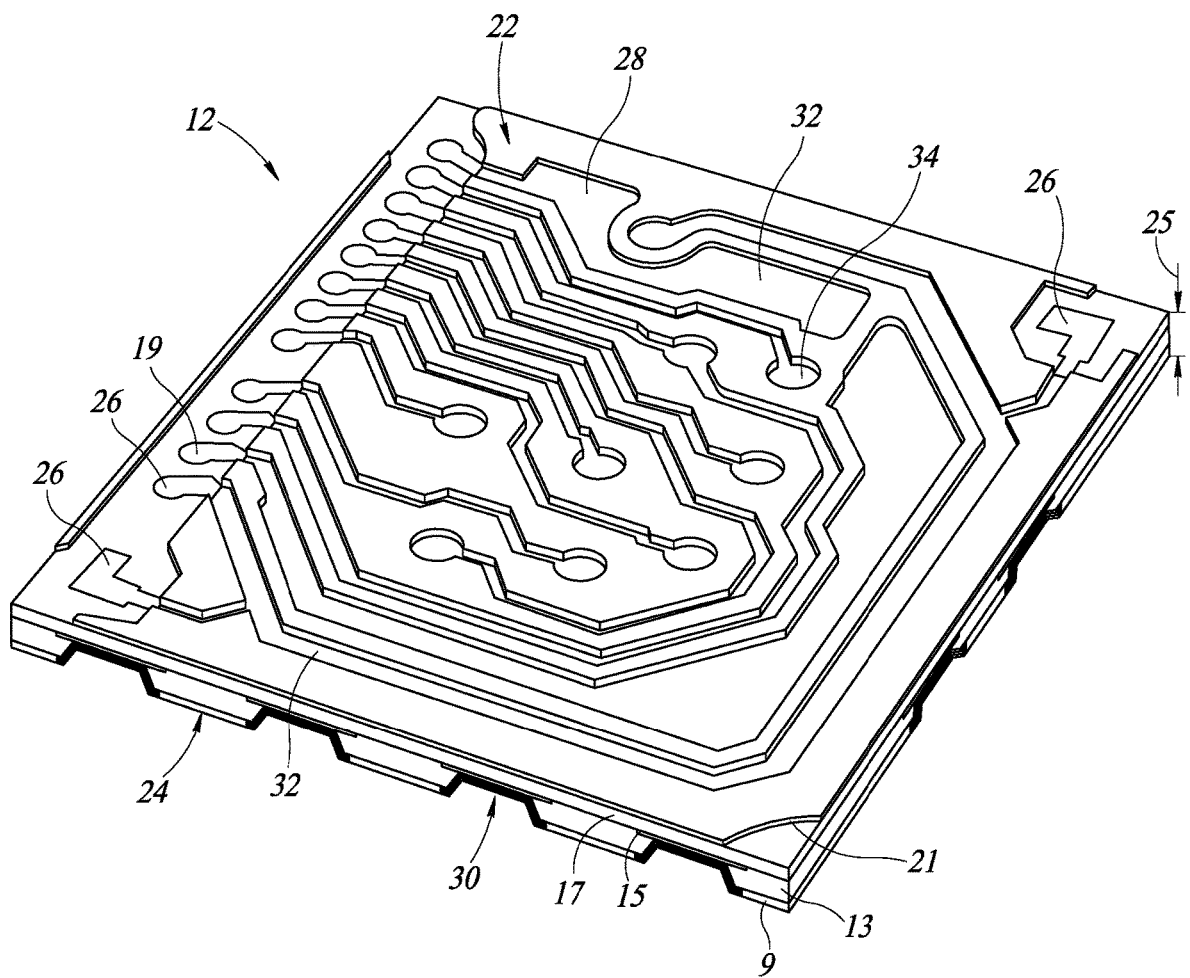
FIG. 2 is an angled view of a first side of a substrate according to one embodiment disclosed herein.
Figure 3:
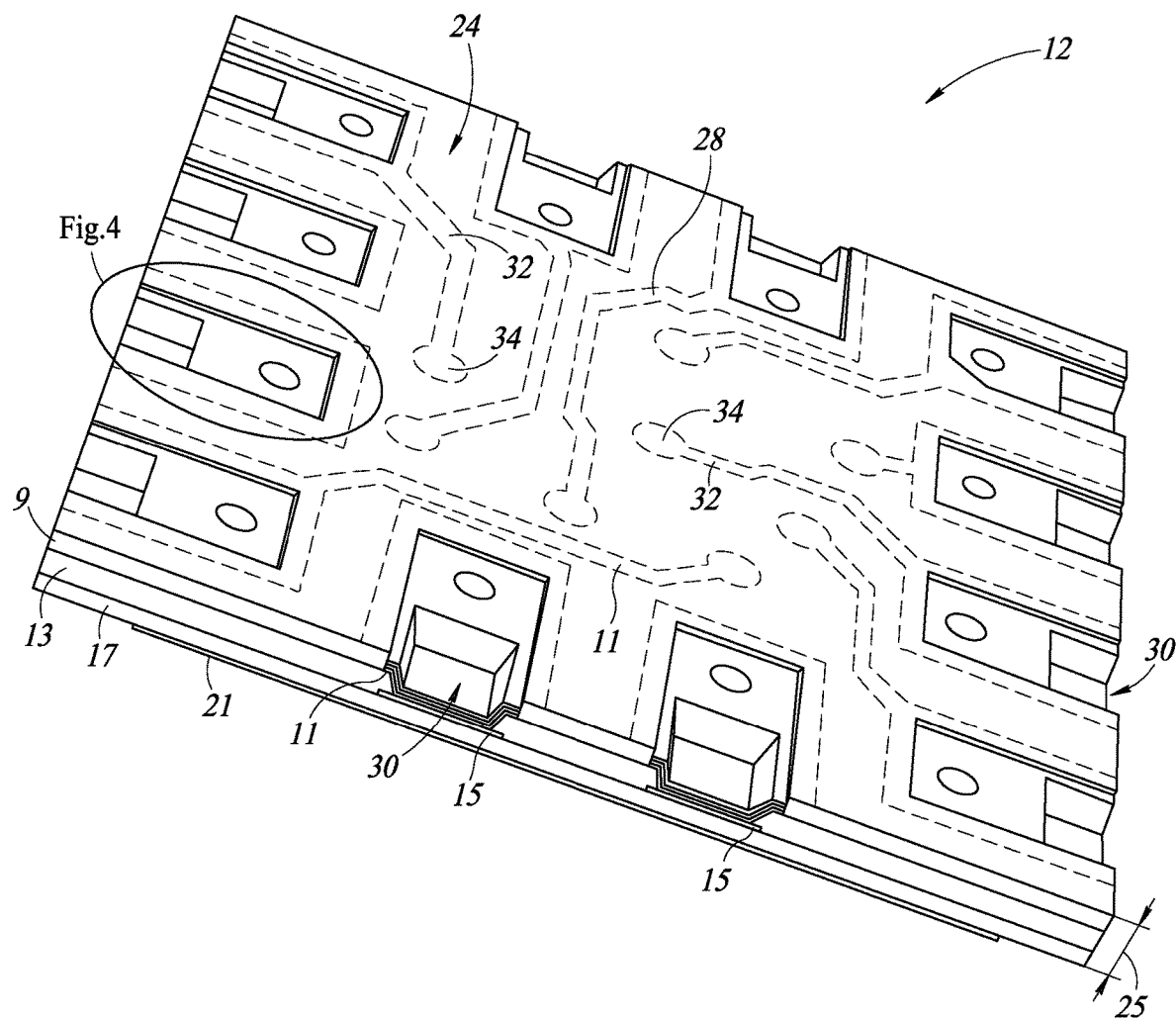
FIG. 3 is an angled view of a second side of the substrate according to one embodiment disclosed herein.

FIG. 2 is an angled view of the first side 22 of the substrate 12 according to one embodiment disclosed herein. FIG. 3 is an angled view of the second side 24 of the substrate 12 according to one embodiment disclosed herein. It is beneficial to review FIGS. 2 and 3 together. It is noted that the semiconductor die 14 and the encapsulation material 16 are removed from the substrate 12 in FIGS. 2 and 3.

The substrate 12 includes a first protective layer 9, a first conductive layer 11, a first support layer 13, a second conductive layer 15, a second support layer 17, a third conductive layer 19, a second protective layer 21, a plurality of contact pads 26 on the first side 22; a plurality of electrical connections 28 on both the first side 22 and the second side 24, and a plurality of slot structures 30 on the second side 24.

The substrate 12 may be formed using standard semiconductor processing techniques known or later developed. For example, each of the first protective layer 9, the first conductive layer 11, the first support layer 13, the second conductive layer 15, the second support layer 17, the third conductive layer 19, and the second protective layer 21 may be formed using pattern deposition or a combination of blanket deposition and etching.

The first protective layer 9 is formed on the second side 24 of the substrate, and provides a protective layer for the second side 24 of the substrate 12. The first protective layer 9 may be made of any type of dielectric material. In one embodiment, the first protective layer 9 is a solder mask.

The first conductive layer 11 is formed between the first protective layer 9 and the first support layer 13. As will be discussed in further detail below, the first conductive layer 11 includes a plurality of electrical connections 28 on the second side 24 of the substrate 12, and forms portions of the plurality of slot structures 30 on the second side 24 of the substrate 12. The first conductive layer 11 may be made of any type of conductive material. In one embodiment, the first conductive layer 11 is made of one or more copper, nickel, aluminum, and gold.

The first support layer 13 is formed between the first conductive layer 11 and the second conductive layer 15. The first support layer 13 provides a support or a platform for the other layers (e.g., the first protective layer 9, the first conductive layer 11, the second conductive layer 15, the third conductive layer 19, and the second protective layer 21). As will be discussed in further detail below, the first support layer 13 forms portions of the plurality of slot structures 30 on the second side 24 of the substrate 12. The first support layer 13 may be made of any type of dielectric material. In one embodiment, the first support layer 13 is a pre-impregnated (i.e., pre-peg) layer.

The second conductive layer 15 is formed between the first support layer 13 and the second support layer 17. As will be discussed in further detail below, the second conductive layer 15 forms portions of the plurality of slot structures 30 on the second side 24 of the substrate 12. The second conductive layer 15 may be made of any type of conductive material. In one embodiment, the second conductive layer 15 is made of one or more copper, nickel, aluminum, and gold.

The second support layer 17 is formed between the second conductive layer 15 and the third conductive layer 19. The second support layer 17 provides a support or a platform for the other layers (e.g., the first protective layer 9, the first conductive layer 11, the second conductive layer 15, the third conductive layer 19, and the second protective layer 21). As will be discussed in further detail below, the second support layer 17 forms portions of the plurality of slot structures 30 on the second side 24 of the substrate 12. The second support layer 17 may be made of any type of dielectric material. In one embodiment, the first support layer 13 is a pre-impregnated (i.e., pre-peg) layer.

Although the first support layer 13 and the second support layer 17 are shown as separate layers in FIGS. 2 and 3, the first support layer 13 and the second support layer 17 may be a single layer. For example, in one embodiment, the first support layer 13 and the second support layer 17, together, form a single pre-layer. In one embodiment, the first support layer 13 and the second support layer 17 are made of the same material.

The third conductive layer 19 is formed between the second support layer 17 and the second protective layer 21. As will be discussed in further detail below, the third conductive layer 19 includes a plurality of contact pads 26 on the first side 22 of the substrate 12, and a plurality of electrical connections 28 on the first side 22 of the substrate 12; and forms portions of the plurality of slot structures 30 on the second side 24 of the substrate 12. The third conductive layer 19 may be made of any type of conductive material. In one embodiment, the second conductive layer 15 is made of one or more copper, nickel, aluminum, and gold. In one embodiment, the first conductive layer 11, the second conductive layer 15, and the third conductive layer 19 are made of the same material.

The second protective layer 21 is formed on the first side 22 of the substrate, and provides a protective layer for the first side 22 of the substrate 12. The second protective layer 21 may be made of any type of dielectric material. In one embodiment the second protective layer 21 is a solder mask. In one embodiment, as shown in FIG. 2, the second protective layer 21 is etched to expose the electrical connections 28 on the first side 22 of the substrate 12. Stated differently, the second protective layer 21 is raised to extend above the electrical connections 28.

The third conductive layer 19 includes the plurality of contact pads 26 on the first side 22 of the substrate 12. The contact pads 26 provide conductive areas for the semiconductor die 14 to electrically connect to. In one embodiment, the contact pads 26 are electrically coupled to the semiconductor die 14 via a plurality of wires. For example, each of the contact pads 26 may receive one or more wires that are electrically coupled to the semiconductor die 14. The contact pads 26 may be positioned anywhere on the first side 22 of the substrate 12. In one embodiment, as shown in FIG. 2, the contact pads 26 are aligned with each along a perimeter of the substrate 12.

The first conductive layer 11 includes the plurality of electrical connections 28 on the second side 24 of the substrate 12, and the third conductive layer 19 includes the plurality of electrical connections 28 on the first side 22 of the substrate 12. The electrical connections 28 electrically couple the contact pads 26 and the slot structures 30 to each other. Stated differently, the electrical connections 28 carry electrical signals between the contact pads 26 and the slot structures 30.

The electrical connections 28 include a plurality of conductive tracks or lines 32 and a plurality of conductive vias 34. The conductive tracks 32 are positioned on both the first side 22 and the second side 24 of the substrate 12. The conductive tracks 32 on the first side 22 of the substrate 12 electrically couple the contact pads 26 and the conductive vias 34 to each other, and the conductive tracks 32 on the second side 24 electrically couple the conductive vias 34 and the slot structures 30 to each other. The conductive vias 34 extend through the substrate 12, and electrically couple the conductive tracks 32 on the first side 22 and the conductive tracks 32 on the second side 24 to each other.

The conductive tracks 32 and the conductive vias 34 may have any arrangement on the substrate 12. In one embodiment, as shown in FIG. 2, the conductive tracks 32 on the first side 22 are positioned in a central region of the substrate 12 such that the conductive tracks directly underlie the semiconductor die 14 when positioned on the substrate 12. In one embodiment, as shown in FIG. 3, the conductive tracks 32 on the second side 24 are positioned in a central region of the substrate 12 and are surrounded by the slot structures 30.

As the first side 22 of the substrate 12 does not include any slot structures 30, the entire first side 22 of the substrate 12 may be used for the contact pads 26 and the electrical connection 28. As a result, the substrate 12 may include a plethora of electrical connections 28 on the first side 22 of the substrate 12 compared to substrates for conventional semiconductor packages.

The plurality of slot structures 30 receive solder when mounting (i.e., soldering) the semiconductor package 10 to the external component, such as a PCB. Compared to traditional leads or contact pads, the slot structures 30 provide multiple, large wettable surfaces that encourage the formation of solder such that solder consistently extends outward from the semiconductor package 10 to form solder fillets. The slot structures 30 are positioned along a perimeter of the substrate 12 on the second side 24. In one embodiment, as shown in FIG. 3, the slot structures 30 are positioned along each of the four sidewalls of the substrate 12.

Although twelve slot structures are shown in FIG. 3, the substrate 12 may include any number of slot structures with multiple different configurations. For example, the substrate 12 may include one, five, or ten slot structures on each of the four sidewalls of the substrate. In one embodiment, as will be discussed in further detail below, one or more layers of the slot structures 30 are electrically connected to the electrical connections 28.

Figure 4:
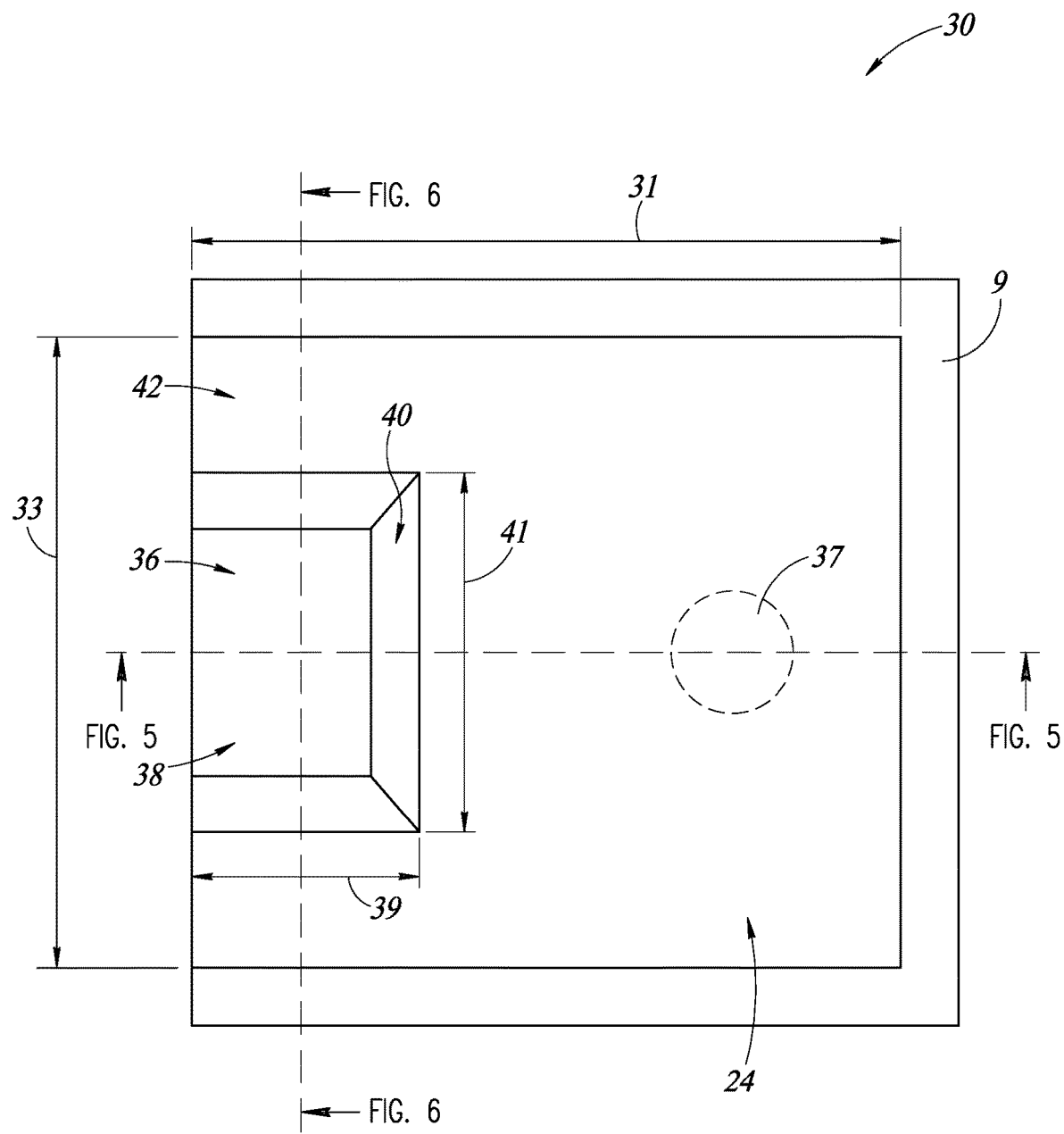
FIG. 4 is an enlarged plan view of a slot structure according to one embodiment disclosed herein.
Figure 5:
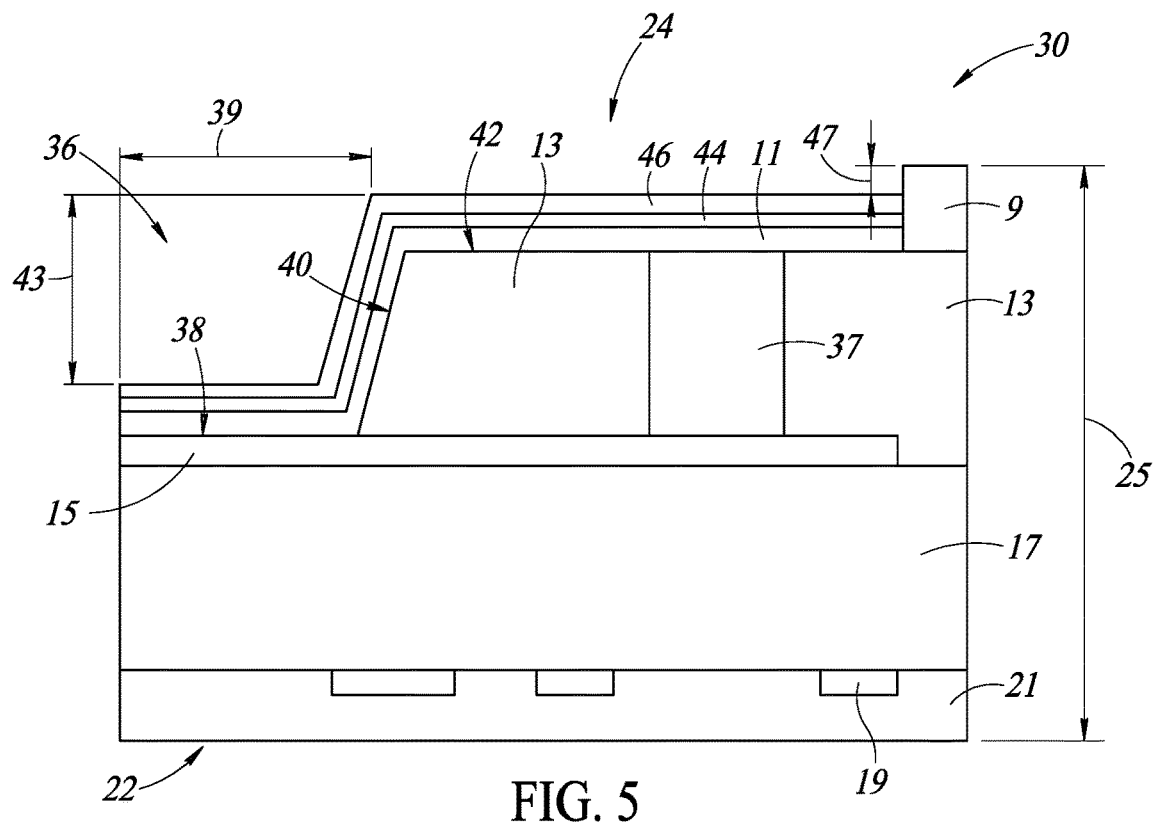
FIG. 5 is a cross-sectional view of a slot structure along the axis shown in FIG. 4 according to one embodiment disclosed herein.
Figure 6:
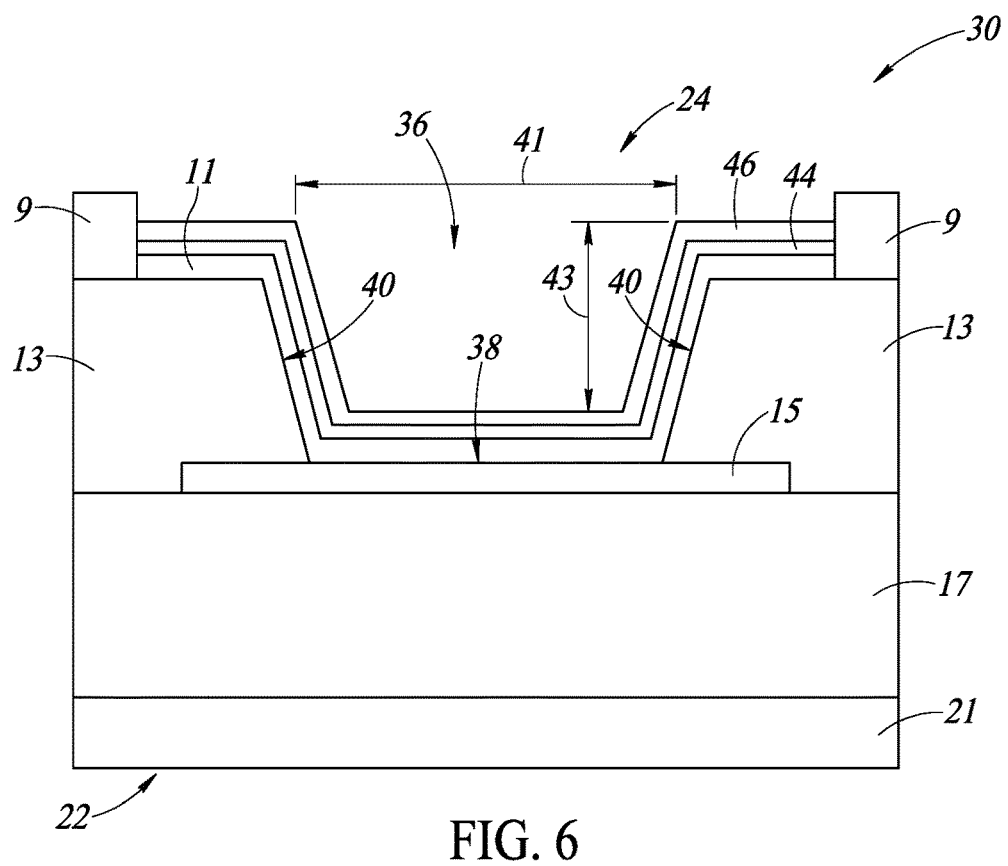
FIG. 6 is a cross-sectional view of a slot structure along the axis shown in FIG. 4 according to one embodiment disclosed herein.

FIG. 4 is an enlarged plan view of one of the slot structures 30 according to one embodiment disclosed herein. FIG. 5 is a cross-sectional view of the slot structure 30 along the axis shown in FIG. 4 according to one embodiment disclosed herein. FIG. 6 is a cross-sectional view of the slot structure 30 along the axis shown in FIG. 4 according to one embodiment disclosed herein. It is beneficial to review FIGS. 4, 5, and 6 together.

The slot structures 30 are multi-layer structures formed from the first protective layer 9, the first conductive layer 11, the first support layer 13, the second conductive layer 15, the second support layer 17, the third conductive layer 19, and the second protective layer 21 of the substrate 12. As discussed above, the first protective layer 9 is formed on the second side 24 of the substrate, the first conductive layer 11 is formed between the first protective layer 9 and the first support layer 13, the first support layer 13 is formed between the first conductive layer 11 and the second conductive layer 15, the second conductive layer 15 is formed between the first support layer 13 and the second support layer 17, the second support layer 17 is formed between the second conductive layer 15 and the third conductive layer 19, the third conductive layer 19 is formed between the second support layer 17 and the second protective layer 21, and the second protective layer 21 is formed on the first side 22 of the substrate. In one embodiment, each of the slot structures 30 has a width 31 that is between 75 and 100 micrometers. In one embodiment, each of the slot structures 30 has a length 33 that is between 50 and 75 micrometers. Each of the slot structures 30 includes a slot 36 and a support pillar 37.

The slot 36 is a recess that extends into the substrate 12 from the second side 24 of the substrate 12. In one embodiment, as best shown in FIGS. 4 and 5, the slot 36 has a width 39 that is between 25 and 35 micrometers. In one embodiment, as best shown in FIGS. 4 and 6, the slot 36 has a length 41 that is between 30 and 40 micrometers. In one embodiment, as best shown in FIGS. 5 and 6, the slot 36 has a depth 43 that is between 25 and 35 micrometers.

The slot 36 includes a base 38, a sidewall 40, and a planar upper surface 42. The base 38 is formed by the second conductive layer 15, and the sidewall 40 and the upper surface 42 is formed by the first support layer 13. In one embodiment, as best shown in FIGS. 5 and 6, the sidewall 40 is angled. In one embodiment, as best shown in FIG. 4, the first support layer 13 is positioned along three sides of the slot 36. The first conductive layer 11 is formed on the base 38 (i.e., the second conductive layer 15), the sidewall 40 (i.e., the first support layer 13), and the upper surface 42 (i.e., the first support layer 13).

In one embodiment, portions of the first conductive layer 11 in the slot structures 30 are covered with one or more layers of conductive plating to improve the wettability of the slot structures 30. In one embodiment, as best shown in FIGS. 5 and 6, a first conductive plating 44 and a second conductive plating 46 are formed on the first conductive layer 11 in the slot structures 30. Stated differently, the first conductive plating 44 and the second conductive plating 46 are formed on the base 38, the sidewall 40, and the upper surface 42 of the slot 36. The conductive plating may be made of any type of conductive material. In one embodiment, the conductive plating is made of one or more nickel and gold. In one embodiment, the first conductive plating 44 is made of nickel, and the second conductive plating 46 is made of gold.

In one embodiment, the first protective layer 9 surrounds each of the slot structures 30. For example, as best shown in FIG. 4, the first protective layer 9 is positioned along three sides of the slot structure 30. In one embodiment, as best shown in FIGS. 5 and 6, the first protective layer 9 is in direct contact with the first support layer 13. In one embodiment, the first protective layer 9 extends above the first conductive layer 11, the first conductive plating 44, and the second conductive plating 46 to prevent solder deposited on the slot structure 30 from overflowing on top of the upper surface of the first protective layer 9 on the second side 24 of the substrate 12. In one embodiment, as shown in FIG. 5, the first protective layer 9 extends past the second conductive plating 46 by a distance 47 that is between 3 and 6 micrometers.

The support pillar 37 acts as a mechanical anchor point that improves the overall strength of the slot structure 30. In one embodiment, as best shown in FIG. 5, the support pillar 37 is formed between the first conductive layer 11 and the second conductive layer 15; and extends through the first support layer 13. In one embodiment, the support pillar 37 is made of a conductive material and electrically couples the first conductive layer 11 and the second conductive layer 15 to each other. In one embodiment, the support pillar 37 is made of one or more copper, nickel, aluminum, and gold. In one embodiment, the support pillar 37 is made of the same material as the first conductive layer 11, the second conductive layer 15, and/or the third conductive layer 19.

Although a single support pillar 37 is shown in FIGS. 4 and 5, each of the slot structures 30 may include any number of support pillars between the first conductive layer 11 and the second conductive layer 15. In one embodiment, each of the slot structures 30 includes at least two support pillars between the first conductive layer 11 and the second conductive layer 15.

Figure 7:
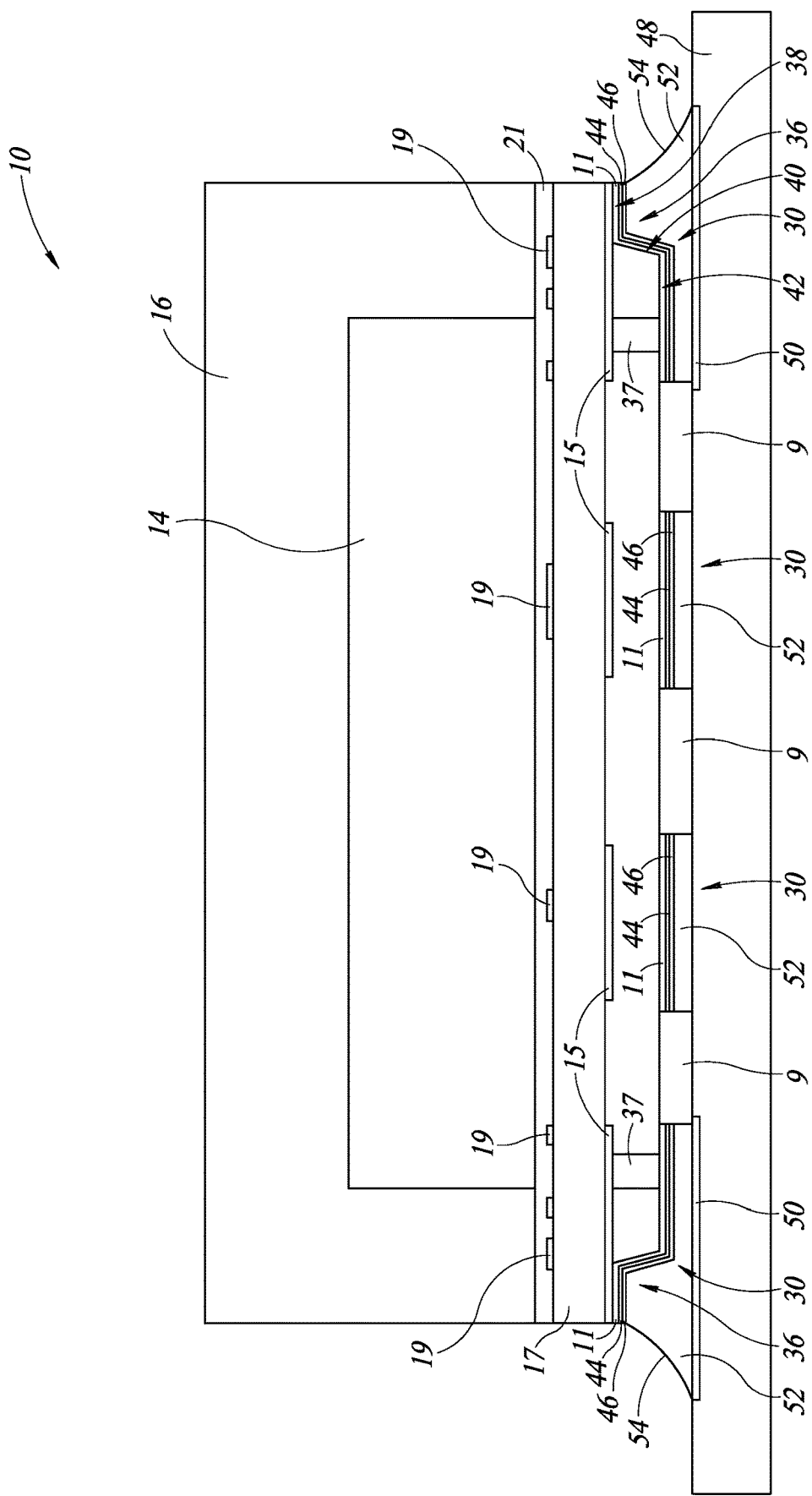
FIG. 7 is a cross-sectional view of a semiconductor package soldered to a printed circuit board according to one embodiment disclosed herein.

As discussed above, the plurality of slot structures 30 receive solder when soldering the semiconductor package 10 to, for example, a PCB. Compared to traditional leads or contact pads, the slot structures 30 provide multiple, large wettable surfaces that encourage the formation of solder such that solder consistently extends outward from the semiconductor package 10 to form solder fillets. FIG. 7 is a cross-sectional view of the semiconductor package 10 soldered to a PCB 48 according to one embodiment disclosed herein.

The semiconductor package 10 is mounted to the PCB 48 by soldering the slot structures 30 of the semiconductor package 10 to contact pads 50 of the PCB 48. In one embodiment, for example, solder 52 is deposited on the contact pads 50. The semiconductor package 10 is then placed on the solder 52 such that the solder 52 is formed between the slot structures 30 and the contact pads 50 as shown in FIG. 7. In one embodiment, the PCB 48 supports a plurality of different chips and electronic devices. Although the semiconductor package 10 is soldered to the PCB 48 in FIG. 7, the semiconductor package 10 may be soldered to any type of substrate.

The slot structures 30 improve the formation of solder fillets by providing multiple, large wettable surfaces with the slots 36. For example, the base 38, the sidewall 40, and the upper surface 42 of the slots 36 provide wettable surfaces for solder to adhere to. In addition, the slots 36, themselves, allow for an increased amount of solder 52 to be deposited between the slot structures 30 and the PCB 48. As a result, when the semiconductor package 10 is mounted to the PCB 48, the, solder 52 on the slot structures 30 will consistently extend outward from the semiconductor package 10 to form solder fillets 54. As the solder fillets 54 extend outward from the semiconductor package 10, solder joint terminations may be easily checked by inspection systems. For example, the solder fillets 54 may easily be seen by visual systems, such as AOI systems. Accordingly, the semiconductor package 10 is suitable for high reliability applications in which each solder joint termination should be checked to ensure a proper electrical connection has been made.

Figure 8:
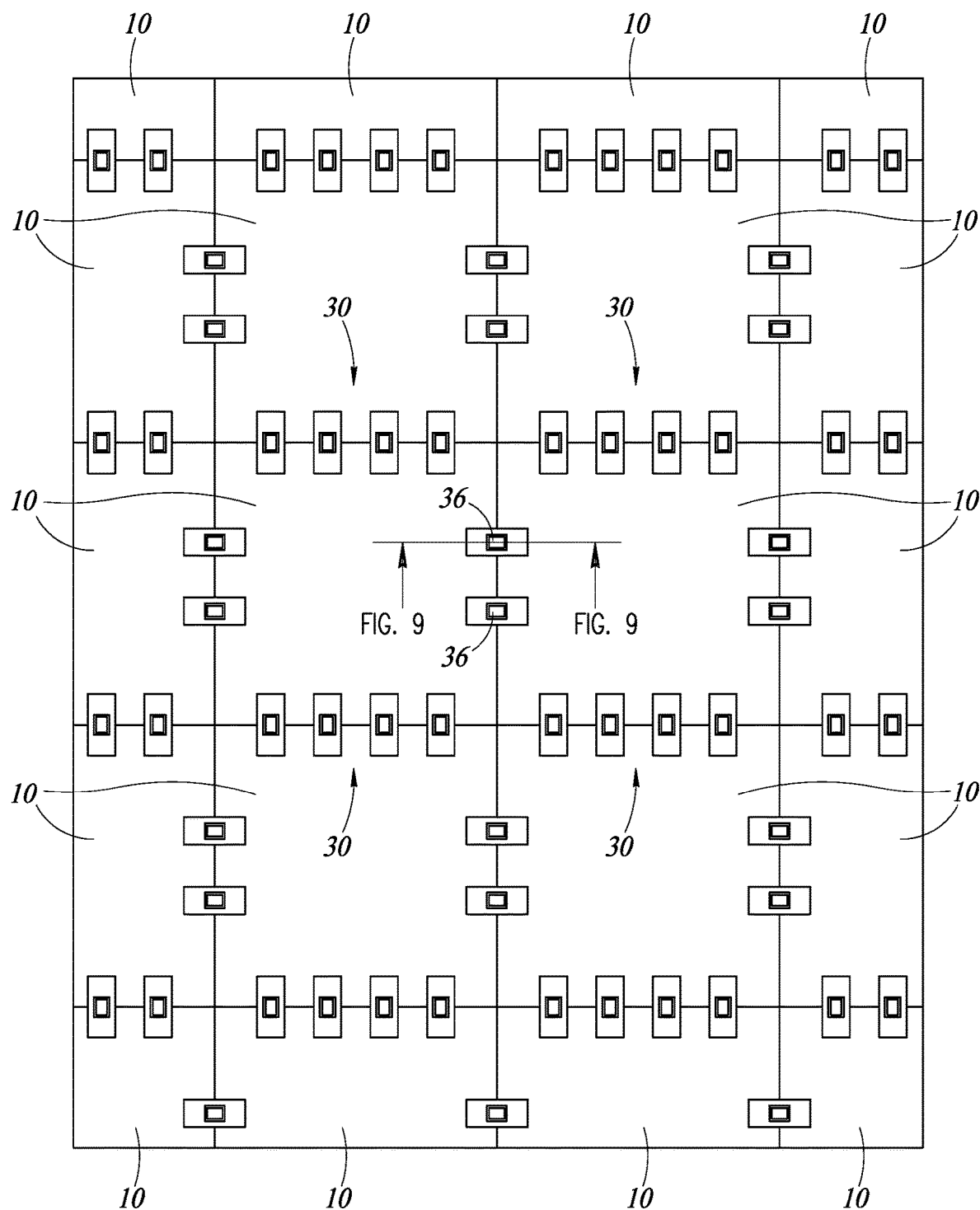
FIG. 8 is a plan view of a plurality of semiconductor packages according to one embodiment disclosed herein.
Figure 9:
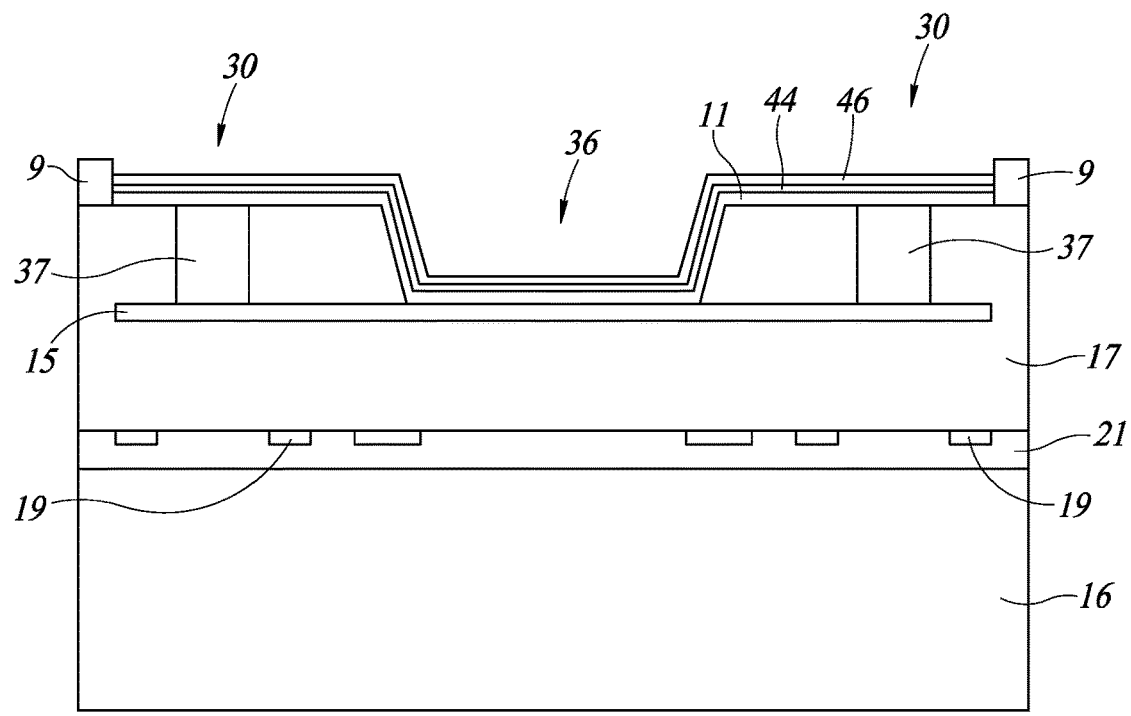
FIG. 9 is a cross-sectional view of two adjacent semiconductor packages along the axis shown in FIG. 8 before a full-cut singulation process is performed according to one embodiment disclosed herein.
Figure 10:
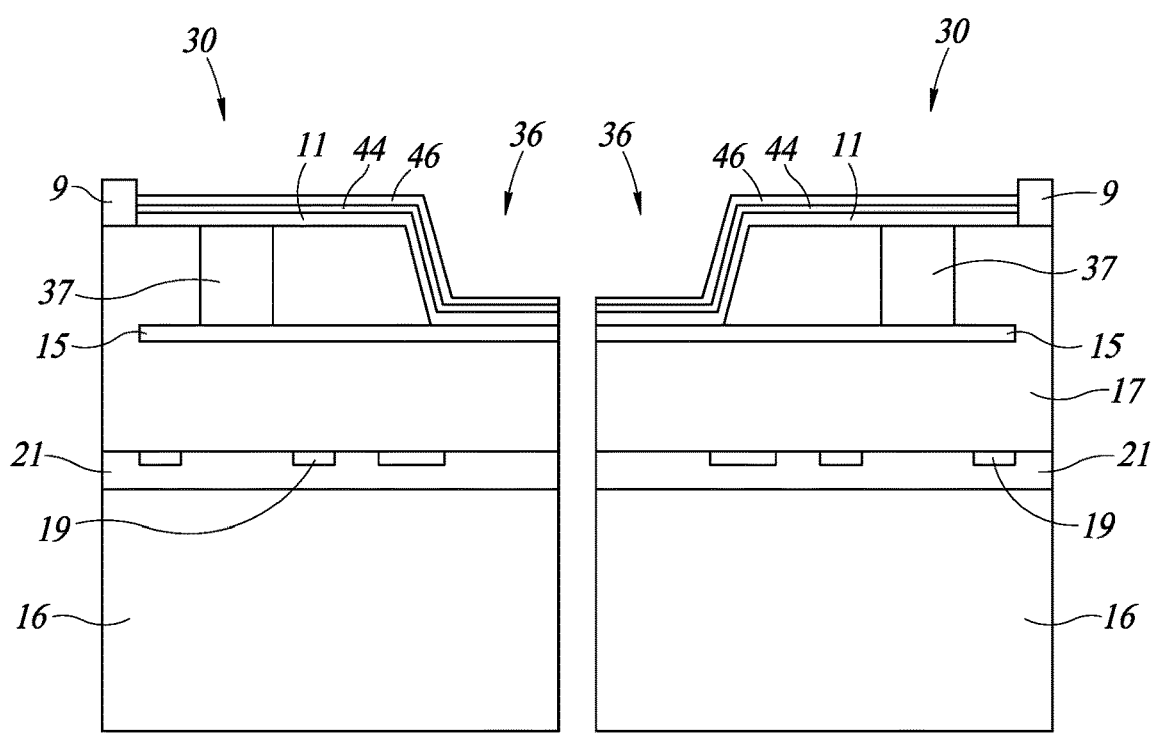
FIG. 10 is a cross-sectional view of two adjacent semiconductor packages along the axis shown in FIG. 8 after a full-cut singulation process is performed according to one embodiment disclosed herein.

FIGS. 8 to 10 are subsequent stages of a full-cut singulation process of a plurality of semiconductor packages according to one embodiment disclosed herein.

FIG. 8 is a plan view of a plurality of semiconductor packages 10 according to one embodiment disclosed herein. FIG. 9 is a cross-sectional view of two adjacent semiconductor packages 10 along the axis shown in FIG. 8 before a full-cut singulation process is performed according to one embodiment disclosed herein. It is beneficial to review FIGS. 8 and 9 together.

The semiconductor packages 10 shown in FIGS. 8 and 9 are after substrate fabrication process, a pre-assembly process, and a molding process have been performed. A full-cut singulation process has not been performed.

In the substrate fabrication process, a plurality of the substrates 12 are fabricated. The plurality of substrates 12 are physically coupled together. As described above, the substrates 12 includes a first protective layer 9, a first conductive layer 11, a first support layer 13, a second conductive layer 15, a second support layer 17, a third conductive layer 19, a second protective layer 21, a plurality of contact pads 26 on the first side 22, a plurality of electrical connections 28 on both the first side 22 and the second side 24, and a plurality of slot structures 30 on the second side 24. The plurality of substrates 12 may be formed using standard semiconductor processing techniques known or later developed. For example, each of the first protective layer 9, the first conductive layer 11, the first support layer 13, the second conductive layer 15, the second support layer 17, the third conductive layer 19, and the second protective layer 21 may be formed using pattern deposition or a combination of blanket deposition and etching.

In the pre-assembly process, a plurality of the semiconductor dies 14 are attached to the plurality of the substrates 12. Namely, each of the semiconductor dies 14 is attached to a respective substrate 12 on the first side 22. In one embodiment, as discussed above, the semiconductor dies 14 are attached to the substrates 12 by adhesive material. In the pre-assembly process, the plurality of the semiconductor dies 14 are also electrically coupled to the plurality of the substrates 12. For example, in one embodiment, a wire bond process is used to electrically couple each of the semiconductor dies 14 to the contact pads 26 of a respective substrate 12.

In the molding process, the encapsulation material 16 is formed on the substrates 12 and the semiconductor dies 14. In particular, the encapsulation material 16 is formed over the semiconductor dies 14 on the first side 22 of the substrates 12.

Before a full-cut singulation process is performed, the substrates 12 are physically coupled together. Each of the slot structures 30 of a substrate 12 are aligned with another slot structure 30 of another adjacent substrate 12. For example, as best shown in FIG. 9, two slot structures 30 of two adjacent substrates 12 are adjoined with each other such that the slots 36 of the slot structures 30 form a single larger slot.

FIG. 10 is a cross-sectional view of two adjacent semiconductor packages along the axis shown in FIG. 8 after a full-cut singulation process is performed according to one embodiment disclosed herein.

In the full-cut singulation process, the semiconductor packages 10 are separated into individual semiconductor packages by cutting at the edges of the semiconductor packages 10. In particular, the semiconductor packages 10 are cut into the slots 36 of the slot structures 30. The leadless semiconductor packages may be separated using any type of singulation process. In one embodiment, the leadless semiconductor packages are separated by dicing. An angled view of a semiconductor package 10 after the full-cut singulation process is shown in FIG. 1.

The various embodiments provide a semiconductor package including a substrate. The substrate includes a lower surface with a plurality of slot structures that facilitates the formation of solder joints. Each of the slot structures provide multiple wettable surfaces for solder to adhere to, and include a slot that allows for an increased amount of solder to be deposited between the slot structures and, for example, a PCB. The semiconductor package is suitable for high reliability applications, such as automotive applications, in which each solder joint termination should be checked by visual systems to ensure a proper electrical connection has been made.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A substrate, comprising:
a plurality of slot structures positioned along a perimeter of the substrate, each of the plurality of slot structures including:
a first conductive layer;
a first support layer;
a second conductive layer, the first support layer positioned between the first conductive layer and the second conductive layer;
a second support layer;
a third conductive layer on the second support layer, the second support layer positioned between the second conductive layer and the third conductive layer; and
a slot extending into an edge portion of the first support layer, the slot having a base that is the second conductive layer and a sidewall that is the first support layer, a continuous portion of the first conductive layer being on the edge portion of the first support layer, the base, and the sidewall; and
a pillar extending from the continuous portion of the first conductive layer that is on the edge portion of the first support layer, through the first support layer, and to the second conductive layer.

2. The substrate of claim 1 wherein the pillar is positioned lateral to the sidewall of the slot.

3. The substrate of claim 1 wherein the pillar is made of a conductive material.

4. The substrate of claim 1, further comprising:
a first conductive plating on the first conductive layer, the first conductive plating being spaced from the edge portion of the first support layer, the base, and the sidewall by the first conductive layer.

5. The substrate of claim 1, further comprising:
a protective layer that is positioned on at least three sides of each of the plurality of slot structures.

6. The substrate of claim 5 wherein the protective layer physically contacts the first support layer.

7. The substrate of claim 4, further comprising:
a second conductive plating on the first conductive plating, the second conductive plating being spaced from the edge portion of the first support layer, the base, and the sidewall by the first conductive layer and the first conductive plating.

8. The substrate of claim 1, further comprising:
a protective layer, the third conductive layer being positioned between the second support layer and the protective layer.

9. The substrate of claim 1 wherein the edge portion is positioned along a perimeter of the first support layer.

10. A substrate, comprising:
a plurality of slots;
a first conductive layer;
a first support layer, the plurality of slots extending into edge portions of the first support layer, the first support layer forming sidewalls of the plurality of slots;
a second conductive layer spaced from the first conductive layer by the first support layer, the second conductive layer forming bases of the plurality of slots, portions of the first conductive layer being on the edge portions of the first support layer, the sidewalls of the plurality of slots, and the bases of the plurality of slots;
a plurality of pillars, each of the portions of the first conductive layer being spaced from the second conductive layer by a respective pillar of the plurality of pillars;

a second support layer; and
a third conductive layer spaced from the second conductive layer by the second support layer.

11. The substrate of claim 10 wherein the first conductive layer includes a plurality of conductive lines.

12. The substrate of claim 10 wherein the third conductive layer includes a plurality of conductive lines and a plurality of contact pads.

13. The substrate of claim 10 wherein the plurality of slots are positioned along a perimeter of the substrate.

14. A package, comprising:
a substrate having a first side and a second side opposite the first side, the substrate including a plurality of slot structures positioned along a perimeter of the substrate on the second side, each of the plurality of slot structures including:
a planar surface;
a slot extending into an edge portion of the planar surface, the slot having a base and a sidewall, the planar surface being positioned along three sides of the slot;
a conductive layer on the edge portion of the planar surface, the base, and the sidewall; and
a pillar directly underlying a portion of the conductive layer that is on the edge portion of the planar surface; and
a die on the first side of the substrate.

15. The package of claim 14 wherein the substrate includes a protective layer on the second side of the substrate, the protective layer being positioned along the three sides of the slot of each of the plurality of slot structures.

16. The package of claim 15 wherein the planar surface, the base, and the sidewall of each of the plurality of slot structures are left uncovered by the protective layer.

17. The package of claim 14 wherein the substrate includes electrical connections that electrically couple the die to the plurality of slot structures.

18. The package of claim 17 wherein the electrical connections include a plurality of conductive lines on the first side of the substrate.

19. The package of claim 17 wherein the plurality of slot structures are positioned on four sides of the substrate.

* * * * *